United States Patent
Gupta et al.

(10) Patent No.: US 6,225,202 B1
(45) Date of Patent: May 1, 2001

(54) SELECTIVE ETCHING OF UNREACTED NICKEL AFTER SALICIDATION

(75) Inventors: Subhash Gupta; Mei-Sheng Zhou; Simon Chooi; Sangki Hong, all of Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/598,689

(22) Filed: Jun. 21, 2000

(51) Int. Cl.[7] .................................. H01L 21/4763
(52) U.S. Cl. ..................... 438/586; 438/655; 438/683; 438/721
(58) Field of Search ..................... 438/707, 710, 438/720, 721, 586, 592, 655, 682, 683

(56) References Cited

U.S. PATENT DOCUMENTS

| | | | |
|---|---|---|---|
| 4,659,426 | * 4/1987 | Fuller et al. | 216/67 |
| 5,091,050 | * 2/1992 | Fujino et al. | 438/721 |
| 5,259,923 | * 11/1993 | Hori et al. | 156/643 |
| 5,358,601 | 10/1994 | Cathey | 156/656 |

FOREIGN PATENT DOCUMENTS 10-150044 * 6/1998 (JP).

* cited by examiner

Primary Examiner—T. N. Quach
(74) Attorney, Agent, or Firm—George O. Saile; Rosemary L. S. Pike

(57) ABSTRACT

A method for removing unreacted nickel or cobalt after silicidation using carbon monoxide dry stripping is described. Shallow trench isolation regions are formed in a semiconductor substrate surrounding and electrically isolating an active area from other active areas. A gate electrode and associated source and drain regions are formed in the active area wherein dielectric spacers are formed on sidewalls of the gate electrode. A nickel or cobalt layer is deposited over the gate electrode and associated source and drain regions, shallow trench isolation regions, and dielectric spacers. The semiconductor substrate is annealed whereby the nickel or cobalt layer overlying the gate electrode and said source and drain regions is transformed into a nickel or cobalt silicide layer and wherein the nickel or cobalt layer overlying the dielectric spacers and the shallow trench isolation regions is unreacted. The unreacted nickel or cobalt layer is exposed to a plasma containing carbon monoxide gas wherein the carbon monoxide gas reacts with the unreacted nickel or cobalt thereby removing the unreacted nickel or cobalt from the substrate to complete salicidation of the integrated circuit device.

29 Claims, 2 Drawing Sheets

SELECTIVE ETCHING OF UNREACTED NICKEL AFTER SALICIDATION

BACKGROUND OF THE INVENTION (1) Field of the Invention

The invention relates to the fabrication of integrated circuit devices, and more particularly, to a method of removing unwanted nickel or cobalt in the fabrication of integrated circuits.

(2) Description of the Prior Art

In the fabrication of integrated circuits, metal silicides are often formed through a rapid thermal annealing (RTA) process. Metals such as titanium, cobalt, and nickel are typically used in salicidation. After RTA, the unreacted metal is typically removed by wet chemicals. For example, SC-1 (Standard Clean-1 comprising ammonium hydroxide, hydrogen peroxide, and de-ionized water) may be used to remove titanium, SC-2 (Standard Clean-2 comprising hydrochloric acid, hydrogen peroxide, and de-ionized water) and a mixture of sulfuric acid, hydrogen peroxide, and water (SPM) may be used to remove cobalt and nickel. Nitric acid and SPM are also used for the stripping (rework) of cobalt and nickel on bare silicon wafers. The drawbacks of using wet chemicals include the expensiveness of high purity chemicals, disposal costs, and the corrosive nature of the chemicals.

U.S. Pat. No. 4,659,426 to Fuller et al teaches using a carbonyl source for etching a metal, metal silicide, or polysilicon. U.S. Pat. No. 5,358,601 to Cathey shows the etching of a polycide using $CO_2$ and a halogen-containing gas. U.S. Pat. No. 5,259,923 to Hori et al etches the polysilicon layer of a polycide using carbon monoxide. U.S. Pat. No. 5,091,050 to Fujino et al etches aluminum and a transition metal using carbon monoxide.

SUMMARY OF THE INVENTION

A principal object of the present invention is to provide an effective and very manufacturable method of removing unreacted metal after salicidation using dry etching.

A further object of the invention is to provide a method of removing unwanted metal using carbon monoxide dry stripping.

Yet another object is to provide a method of removing unreacted nickel or cobalt after salicidation using carbon monoxide dry stripping.

Yet another object is to provide a method of removing unwanted nickel or cobalt using carbon monoxide dry stripping.

In accordance with the objects of the invention a method for removing unwanted nickel or cobalt using carbon monoxide dry stripping in the manufacture of an integrated circuit is achieved. A nickel or cobalt layer on a substrate is exposed to a plasma containing carbon monoxide gas wherein the carbon monoxide gas reacts with the metal thereby removing the metal from the substrate.

Also in accordance with the objects of the invention a method for removing unreacted nickel or cobalt after salicidation using carbon monoxide dry stripping is achieved. Shallow trench isolation regions are formed in a semiconductor substrate surrounding and electrically isolating an active area from other active areas. A gate electrode and associated source and drain regions are formed in the active area wherein dielectric spacers are formed on sidewalls of the gate electrode. A nickel or cobalt layer is deposited over the gate electrode and associated source and drain regions. The semiconductor substrate is annealed whereby the nickel or cobalt layer overlying the gate electrode and said source and drain regions is transformed into a nickel or cobalt silicide layer and wherein the nickel or cobalt layer overlying the dielectric spacers and the shallow trench isolation regions is unreacted. The unreacted nickel or cobalt layer is exposed to a plasma containing carbon monoxide gas wherein the carbon monoxide gas reacts with the unreacted nickel or cobalt thereby removing the unreacted nickel or cobalt from the substrate to complete salicidation of the integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention provides a method for removing unwanted metal, such as nickel or cobalt, after salicidation or in the case of rework. This method avoids the expense of wet chemical stripping. It will be understood by those skilled in the art that the present invention should not be limited to the embodiment described herein, but can be applied and extended in a variety of applications.

Figure 1:
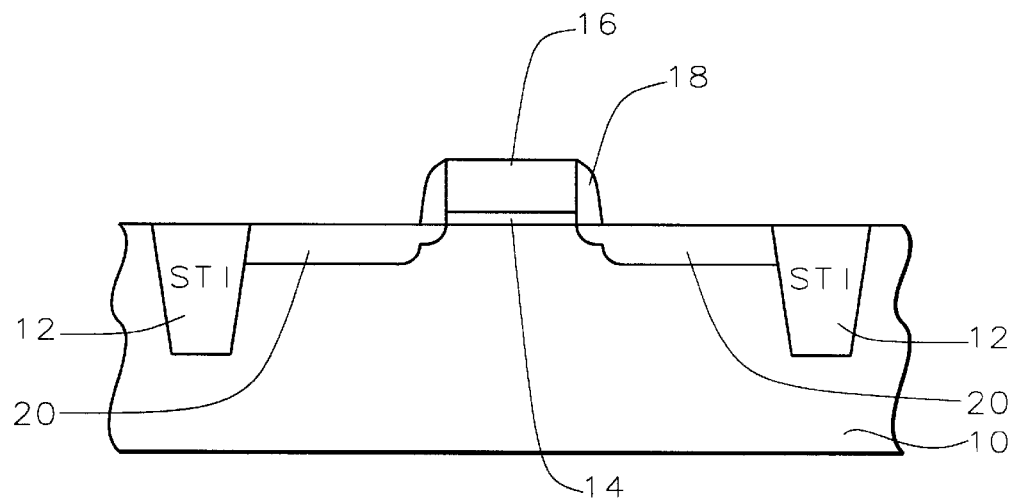
FIGS. 1 through 4 schematically illustrate in cross-sectional representation a preferred embodiment of the present invention.

Removal of unreacted metal after salicidation will be illustrated in FIGS. 1 through 4. Referring now more particularly to FIG. 1, there is illustrated a portion of a partially completed integrated circuit. The semiconductor substrate 10 is preferably composed of silicon having a (100) crystallographic orientation. The substrate may be an n- or p-type silicon. Semiconductor device structures may be formed as is conventional in the art. For example, shallow trench isolation (STI) regions 12 separate active areas of the substrate from one another. A polysilicon gate electrode 16 over gate oxide or any other high dielectric constant material 14, sidewall spacers 18, and source/drain junctions 20 are formed as is conventional. Sidewall spacers 18 typically are comprised of silicon nitride, silicon oxide, or silicon oxynitride.

Figure 2:
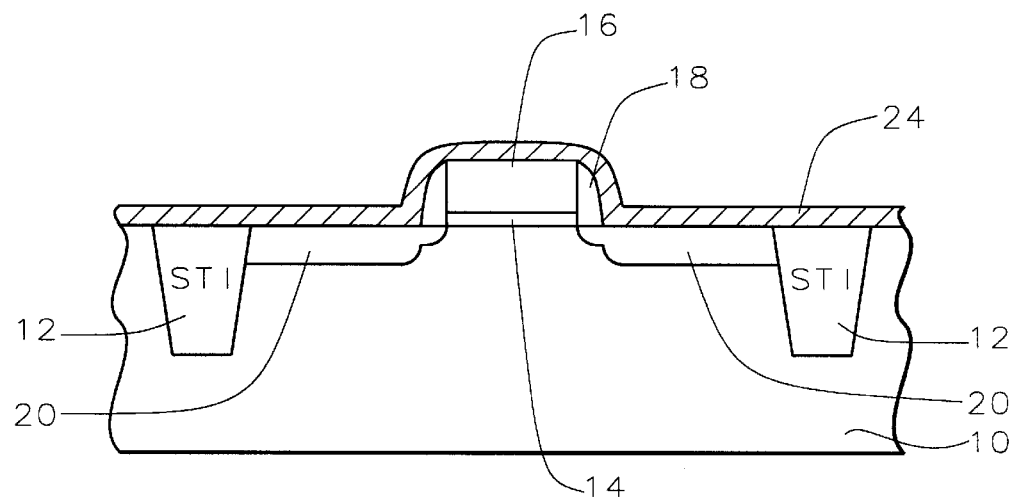
Figure 3:
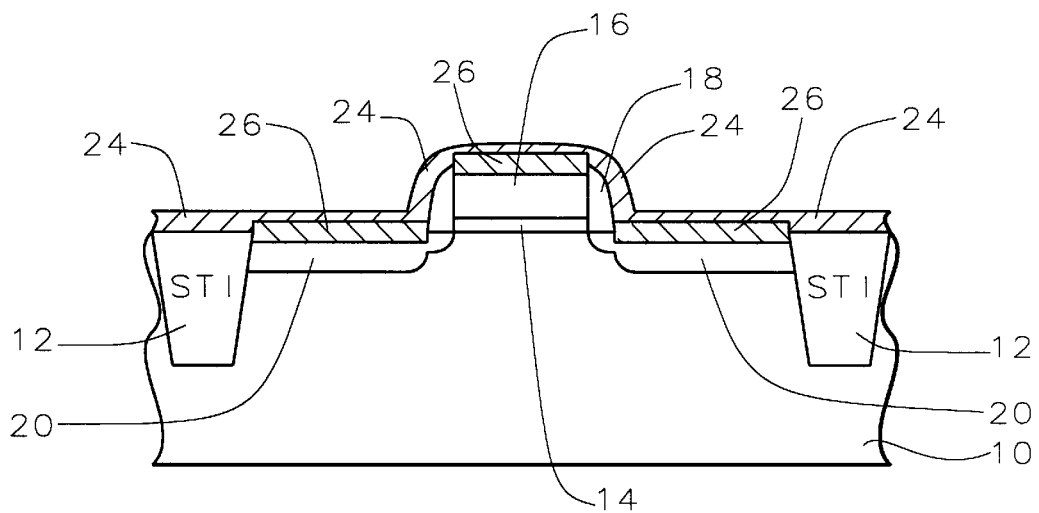

Referring now to FIG. 2, a metal layer 24 is deposited over the surface of the substrate, such as by sputtering. The metal layer 24 may comprise nickel or cobalt or titanium deposited to a thickness of between about 50 and 2000 Angstroms.

In the case of nickel and cobalt, a refractory metal such as titanium may be deposited over the cobalt or nickel to a thickness of between about 50 and 100 Angstroms, not shown. Silicidation results in the formation of the metal silicide on the gate electrode and the associated source and drain regions. The unreacted titanium and nickel or titanium and cobalt can then be removed using carbon monoxide dry stripping.

However, if a titanium nitride layer or a titanium-titanium nitride bilayer is deposited over the nickel or cobalt, the unreacted nickel or cobalt and titanium nitride or the unreacted nickel or cobalt and titanium-titanium nitride cannot be removed using carbon monoxide dry stripping since titanium nitride does not react with carbon monoxide. In applications involving a refractory metal nitride (like titanium nitride), a wet chemical treatment utilizing alkaline solution (e.g. SC-1) may be used to remove the metal nitride or metal nitride/metal before exposing the nickel or cobalt. The unreacted nickel or cobalt is then removed using carbon monoxide as described in the present invention. Alternatively, the unreacted titanium nitride or titanium-titanium nitride can be removed through dry etching wherein the etching chemistry comprises one or more gases from the group containing chlorine, boron trichloride ($BCl_3$), chlorine-substituted hydrocarbons, fluorine, fluorine-substituted hydrocarbons, nitrogen, and argon. The unreacted nickel or cobalt can then be removed using carbon monoxide either in a continuing etching step in the same etching chamber or in another etching chamber in the same equipment, or in another equipment.

A metal silicide 26 is formed, for example, on the gate 16 and over the source/drain regions 20 by a rapid thermal process (RTA). During RTA, most of the metal layer overlying the polysilicon gate 16 and the silicon substrate 10 in the source/drain regions 20 reacts with the underlying silicon to form a metal silicide 26, shown in FIG. 3. The amount of metal that reacts with the underlying silicon depends, amongst other factors, on the thickness of the deposited metal and the duration of the RTA. It is typical to have unreacted metal remaining on top of the metal silicide at the gate electrode and the associated source and drain regions, as shown. The metal layer 24 overlying the dielectric spacers 18 and the STI regions 12 is unreacted.

Now the unreacted metal 24 is to be removed using the dry stripping process of the present invention. Carbon monoxide gas is used as the etchant and either argon or helium is used as the carrier gas in the dry etching process of the invention. If the metal is nickel, the wafer temperature should be maintained at between about 20 and 40° C. during the dry stripping process. This low wafer temperature is highly compatible with shallow junctions.

The selectivity of carbon monoxide toward nickel silicide is very high, resulting in essentially no etching of the nickel silicide regions 26. "Downstream" plasma is sufficient for the reaction so there is minimal plasma induced damage to the shallow trench isolation, source and drain regions, gate electrode, and dielectric spacers. Plasma is an electrically neutral mixture of positive ions, negative ions, electrons, atoms, molecules, and radicals. As plasma-induced damage is caused by positive ions, the prevention or reduction of the positive ions reaching the wafer becomes important, particularly in the present invention where the transistor gate electrode and the source/drain regions are exposed to the plasma. "Downstream" plasma is thus deprived of the damaging positive ions by directing the initial plasma generated by RF or microwave power source through (i) non-straight paths wherein the directional ions are deflected, leaving only the radicals to continue on, or (ii) wide gap wherein a negatively charged barrier is present. The etching reaction is as follows:

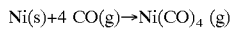

$Ni(s) + 4\ CO(g) \rightarrow Ni(CO)_4\ (g)$

The nickel carbonyl product is volatile and is easily removed through exhaust or under vacuum. This represents a cost savings relative to the wet chemical method.

If the metal 24 is cobalt, a higher wafer temperature of about 80 to 250° C. will be required for a pressure of 10 mTorr to 100 Torr. Carbon monoxide gas along with a carrier gas of argon or helium will remove the unreacted cobalt 24. The etching reaction is:

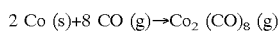

$2\ Co\ (s) + 8\ CO\ (g) \rightarrow Co_2\ (CO)_8\ (g)$ or $Co\ (s) + x\ CO\ (g) \rightarrow Co\ (CO)x\ (g)$ If the metal 24 is titanium, a wafer temperature of about 40 to 250° C. will be required for a pressure of 10 mTorr to 100 Torr. Carbon monoxide gas along with a carrier gas of argon or helium will remove the unreacted titanium 24. The etching reaction is:

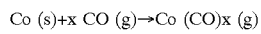

$Ti\ (s) + x\ CO\ (g) \rightarrow Ti\ (CO)x$ (no stable titanium carbonyl compounds have appeared in chemical literature).

Conditions for the removal of nickel, cobalt, or titanium in any conventional plasma etcher or "downstream" plasma asher include CO:argon/helium gas ratio of 1:100 to 100:1, pressure of 10 mTorr to 100 Torr, and power of between 100 to 2000 watts if RF or microwave is capacitively coupled to the plasma.

Figure 4:
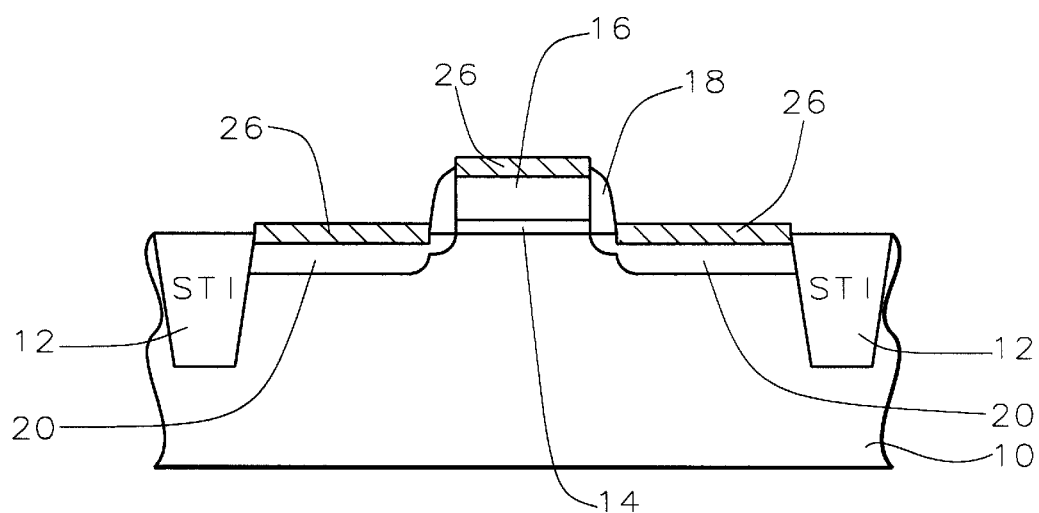

FIG. 4 illustrates the integrated circuit after removal of the unreacted nickel or cobalt 24 according to the process of the present invention. Processing continues as is conventional in the art to complete the integrated circuit device.

The carbon monoxide dry etching process may also be used in the case of stripping/rework of deposited nickel or cobalt on a bare silicon wafer. In this case, the carbon monoxide etchant will remove the metal from the wafer easily and at low cost without wet chemical disposal concerns.

The invention can be extended to the recovery of the nickel or cobalt removed through the insertion of a heat trap between the etching chamber and the exhaust or vacuum pump. This is possible because at a temperature greater than 40° C., the following reaction will occur:

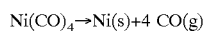

$Ni(CO)_4 \rightarrow Ni(s) + 4\ CO(g)$

A similar reaction occurs for cobalt at a temperature of greater than 250° C.

The process of the invention provides an effective method of removing unreacted nickel or cobalt after silicidation or removing nickel or cobalt on a bare silicon wafer by using a carbon monoxide dry stripping process. The removed nickel or cobalt can be recovered by adding a heat trap between the etching chamber and the exhaust or vacuum pump.

While the invention has been particularly shown and described with reference to the preferred embodiments thereof, it will be understood by those skilled in the art that various changes in form and details may be made without departing from the spirit and scope of the invention.

What is claimed is:

1. A method of removing metal in the fabrication of an integrated circuit device comprising:

providing a metal layer overlying a substrate;

exposing said metal layer to a plasma containing carbon monoxide gas wherein said carbon monoxide gas reacts with said metal thereby removing said metal from said substrate wherein said metal removed comprises a gaseous carbonyl product; and recovering said metal by channeling said gaseous carbonyl product into a heat trap wherein said gaseous carbonyl product separates into metal and carbon monoxide molecules.

2. The method according to claim 1 wherein said metal layer is selected from the group consisting of nickel and cobalt.

3. The method according to claim 1 wherein said plasma also comprises a carrier gas is selected from the group consisting of argon and helium.

4. The method according to claim 1 wherein said metal layer comprises nickel and wherein said substrate is maintained at a temperature of between about 20 and 40° C. during said step of exposing said metal layer to said plasma.

5. The method according to claim 1 wherein said metal layer comprises cobalt and wherein said substrate is maintained at a temperature of between about 80 and 250° C. during said step of exposing said metal layer to said plasma.

6. The method according to claim 1 wherein said metal layer comprises nickel and wherein said substrate is maintained at a temperature of between about 20 and 40° C. during said step of exposing said unreacted metal layer to said plasma.

7. The method according to claim 1 wherein said metal layer comprises cobalt and wherein said substrate is maintained at a temperature of between about 80 and 250° C. during said step of exposing said unreacted metal layer to said plasma.

8. The method according to claim 1 wherein said metal layer comprises titanium and wherein said substrate is maintained at a temperature of between about 40 and 250° C. during said step of exposing said unreacted metal layer to said plasma.

9. The method according to claim 1 wherein said plasma comprises a downstream plasma.

10. A method of siliciding an integrated circuit device comprising:
    forming shallow trench isolation regions in a semiconductor substrate surrounding and electrically isolating an active area from other active areas;
    forming a gate electrode and associated source and drain regions in said active area wherein dielectric spacers are formed on sidewalls of said gate electrode;
    depositing a metal layer over said gate electrode, said source and drain regions, said shallow trench isolation regions, and said dielectric spacers;
    annealing said semiconductor substrate whereby said metal layer overlying said gate electrode and said source and drain regions is transformed into a metal silicide layer and wherein said metal layer overlying said dielectric spacers and said shallow trench isolation regions is unreacted; and
    exposing said unreacted metal layer to a plasma containing carbon monoxide gas wherein said carbon monoxide gas reacts with said unreacted metal thereby removing said unreacted metal from said substrate to complete said siliciding of said integrated circuit device.

11. The method according to claim 10 wherein said metal layer is selected from the group consisting of nickel and cobalt.

12. The method according to claim 10 wherein said plasma also comprises a carrier gas selected from the group consisting of argon and helium.

13. The method according to claim 10 further comprising:
    depositing a titanium layer overlying said metal layer before said annealing step wherein said step of exposing said unreacted metal layer to said plasma also removes unreacted said titanium layer.

14. The method according to claim 10 further comprising:
    depositing a titanium nitride layer overlying said metal layer before said annealing step; and
    removing unreacted said titanium nitride layer before said step of exposing said unreacted metal layer to said plasma.

15. The method according to claim 14 wherein said step of removing unreacted said titanium nitride layer comprises a wet chemical treatment.

16. The method according to claim 14 wherein said step of removing unreacted said titanium nitride layer comprises dry etching.

17. The method according to claim 10 wherein said unreacted metal removed comprises a gaseous carbonyl product.

18. A method of siliciding an integrated circuit device comprising:
    forming shallow trench isolation regions in a semiconductor substrate surrounding and electrically isolating an active area from other active areas;
    forming a gate electrode and associated source and drain regions in said active area wherein dielectric spacers are formed on sidewalls of said gate electrode;
    depositing a nickel layer over said gate electrode, said source and drain regions, said shallow trench isolation regions, and said dielectric spacers;
    annealing said semiconductor substrate whereby said nickel layer overlying said gate electrode and said source and drain regions is transformed into a nickel silicide layer and wherein said nickel layer overlying said dielectric spacers and said shallow trench isolation regions is unreacted; and
    exposing said unreacted nickel layer to a plasma containing carbon monoxide gas wherein said carbon monoxide gas reacts with said unreacted nickel thereby removing said unreacted nickel from said substrate to complete said siliciding of said integrated circuit device.

19. The method according to claim 18 wherein said plasma also comprises a carrier gas selected from the group consisting of argon and helium.

20. The method according to claim 18 wherein said substrate is maintained at a temperature of between about 20 and 40° C. during said step of exposing said unreacted nickel layer to said plasma.

21. The method according to claim 18 wherein said unreacted nickel removed comprises a gaseous carbonyl product.

22. The method according to claim 18 further comprising:
    depositing a titanium layer overlying said nickel layer before said annealing step wherein said step of exposing said unreacted nickel layer to said plasma also removes unreacted said titanium layer.

23. The method according to claim 18 further comprising:
    depositing a titanium nitride layer overlying said nickel layer before said annealing step; and
    removing unreacted said titanium nitride layer before said step of exposing said unreacted nickel layer to said plasma.

24. A method of siliciding an integrated circuit device comprising:
    forming shallow trench isolation regions in a semiconductor substrate surrounding and electrically isolating an active area from other active areas;
    forming a gate electrode and associated source and drain regions in said active area wherein dielectric spacers are formed on sidewalls of said gate electrode;
    depositing a cobalt layer over said gate electrode said source and drain regions, said shallow trench isolation regions, and said dielectric spacers;
    annealing said semiconductor substrate whereby said cobalt layer overlying said gate electrode and said source and drain regions is transformed into a cobalt silicide layer and wherein said cobalt layer overlying said dielectric spacers and said shallow trench isolation regions is unreacted; and exposing said unreacted cobalt layer to a plasma containing carbon monoxide gas wherein said carbon monoxide gas reacts with said unreacted cobalt thereby removing said unreacted cobalt from said substrate to complete said siliciding of said integrated circuit device.

25. The method according to claim 24 wherein said plasma also comprises a carrier gas selected from the group consisting of argon and helium.

26. The method according to claim 24 wherein said substrate is maintained at a temperature of between about 80 and 250° C. during said step of exposing said unreacted cobalt layer to said plasma.

27. The method according to claim 24 wherein said unreacted cobalt removed comprises a gaseous carbonyl product.

28. The method according to claim 24 further comprising:
depositing a titanium layer overlying said nickel layer before said annealing step wherein said step of exposing said unreacted nickel layer to said plasma also removes unreacted said titanium layer.

29. The method according to claim 24 further comprising:
depositing a titanium nitride layer overlying said nickel layer before said annealing step; and removing unreacted said titanium nitride layer before said step of exposing said unreacted nickel layer to said plasma.

* * * * *